US006573742B2

(12) United States Patent
Sim

(10) Patent No.: US 6,573,742 B2
(45) Date of Patent: Jun. 3, 2003

(54) SEMICONDUCTOR INTEGRATED CIRCUIT WITH TEST POINTS INSERTED THEREINTO

(75) Inventor: Gyoo-Chan Sim, Kyunggi-do (KR)

(73) Assignee: Samsung Electronics Co., Ltd., Kyunggi-Do (KR)

( * ) Notice: Subject to any disclaimer, the term of this patent is extended or adjusted under 35 U.S.C. 154(b) by 14 days.

(21) Appl. No.: 09/828,879

(22) Filed: Apr. 10, 2001

(65) Prior Publication Data

US 2002/0024352 A1 Feb. 28, 2002

(30) Foreign Application Priority Data

Aug. 31, 2000 (JP) ........................................ 2000-0051126

(51) Int. Cl.[7] .............................................. G01R 31/28
(52) U.S. Cl. ........................ 324/763; 324/765; 714/729; 714/733
(58) Field of Search ................................ 324/763, 765; 714/726, 727, 729, 733, 734; 716/4

(56) References Cited

U.S. PATENT DOCUMENTS

| | | | | |
|---|---|---|---|---|
| 5,828,828 A | * | 10/1998 | Lin et al. ........................ | 714/30 |
| 6,038,691 A | * | 3/2000 | Nakao et al. ................. | 714/733 |
| 6,070,261 A | * | 5/2000 | Tamarapalli et al. ......... | 714/733 |
| 6,073,254 A | * | 6/2000 | Whetsel ........................ | 714/729 |
| 6,363,520 B1 | * | 3/2002 | Boubezari et al. ............. | 716/4 |

OTHER PUBLICATIONS

Vijay S. Iyengar et al., "Synthesis of Pseudo–Random Pattern Testable Designs", IEEE 1989 International Test Conference, pp. 501–508.

Ben Mathew et al., "Combining Multiple DFT Schemes with Test Generation", IEEE Transactions on Computer–Aided Design of Integrated Circuits and Systems, vol. 18, No. 6, Jun. 1999, pp. 685–696.

Claus Schotten et al., "Test Point Insertion for an Area Efficient Bist", IEEE International Test Conference, 1995, pp. 515–523.

Huan–Chih Tsai et al., "Efficient Test–Point Selection for Scan–Based BIST", IEEE Transactions on Very Large Scale Integration (VLSI) Systems, vol. 6, No. 4, Dec. 1998, pp. 667–676.

Huan–Chih Tsai et al., "A Hybrid Algorithm for Test Point Selection for Scan–Based BIST" Design Automation Conference, 1997, Association for Computing Machinery, Inc., pp. 478–483.

(List continued on next page.)

Primary Examiner—Ernest Karlsen
(74) Attorney, Agent, or Firm—Volentine Francos, PLLC

(57) ABSTRACT

A semiconductor integrated circuit device includes a logic circuit having a plurality of observation points and a control point, a plurality of scan cells, a first multiplexer for selecting one of normal data supplied from the logic circuit or one of data supplied from the one or more observation points and outputting the selected data, and a second multiplexer for outputting one of the normal data and scan data supplied from the scan cells to the control point. A select signal for selecting outputs of the first and second multiplexers may be an output of a scan cell of the device. When test points are inserted into a scan-designed circuit, the device may use existing cells constructed therein to minimize the number of added pins. Thus, it is possible to maximally enhance testability with minimal overhead.

17 Claims, 4 Drawing Sheets

OTHER PUBLICATIONS

H. Troy Nagle et al., "Design for Testability and Built–In Self Test: A Review", IEEE Transactions on Industrial Electronics, Vo. 36, No. 2, May 1989, pp. 129–140.

Balakirshnam Krishnamurthy, "A Dynamic Programming Approach To The Test Point Insertion Problem", 24th ACM/IEEE Design Automation Conference, 1987, pp. 695–705.

Kenneth D. Wagner, "Robust Scan–Based Logic Test in VDSM Technologies",IEEE Computer,Nov. 1999, pp. 66–74.

Peter C. Maxwell, "Design For Testability: Tunnelling Through The Test Wall", IEEE 1997 Custom Integrated Circuits Conference, pp. 199–206.

Nagesh Tamarapalli et al., "Constructive Multi–Phase Test Point Insertion for Scan–Based BIST", 1996 IEEE International Test Conference, pp. 649–658.

Kwang–Ting (Tim) Cheng et al., "Timing–Driven Test Point Insertion for Full–Scan and Partial–Scan BIST", 1995 IEEE International Test Conference, pp. 506–514.

Chung–Hsing Chen et al., "Structural and Behavioral Synthesis for Testability Techniques", IEEE Transactions on Computer–Aided Design of Intergrated Circuits and Systems, Vo. 13, No. 6, Jun. 1994, pp. 777–785.

Michinobu Nakao et al., "Accelerated Test Points Selection Method for Scan–Based BIST", IEEE ATS 1997, pp. 359–364.

* cited by examiner

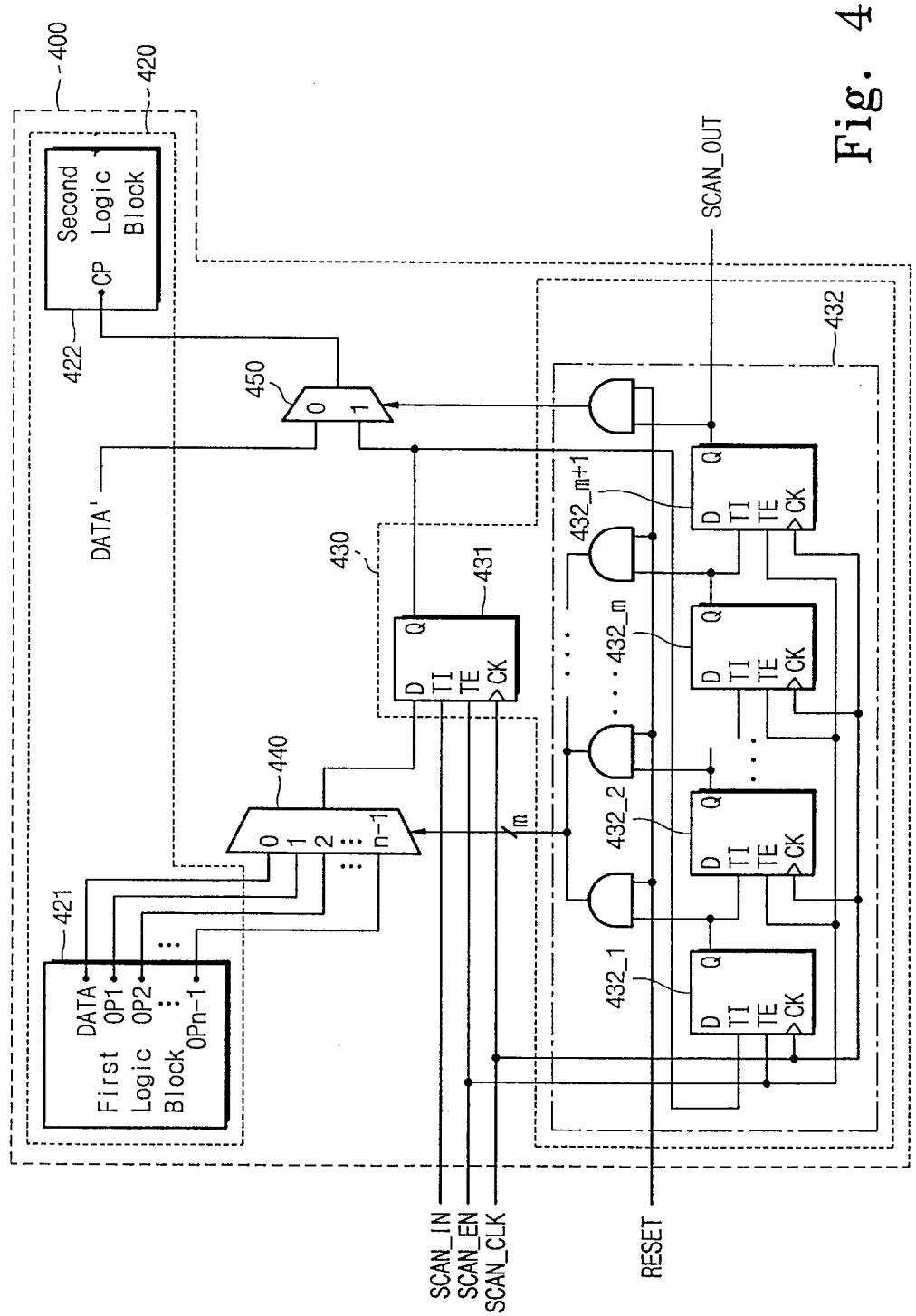

SEMICONDUCTOR INTEGRATED CIRCUIT WITH TEST POINTS INSERTED THEREINTO

The present application claims priority under 35 U.S.C. 119 to Korean Patent Application No. 2000-51126, filed on Aug. 31, 2000, which is hereby incorporated by reference in its entirety for all purposes.

BACKGROUND OF THE INVENTION

1. Field of the Invention

The present invention generally relates to testing of semiconductor integrated circuit devices. More specifically, the present invention is directed to a semiconductor integrated circuit into which test points are inserted to enhance testability and to minimize overhead caused by an increase in the number of input/output terminals.

2. Description of the Related Art

Recently, integration level and complexity of very large scaled integrated (VLSI) circuits has greatly increased with continuous development in design and processing technologies thereof. Therefore, a test to secure perfect operation of a completed system has become more important, as well as to secure a perfect design to meet specification requirements. This leads to a great increase in cost of a test to check whether a completed VLSI system is operable.

As a manner of easily testing a circuit from a design stage, a design for testability (DFT) has recently been introduced and applied. In a DFT, a given circuit is changed or redundant hardware is added to achieve easy testing. Test points are inserted to enhance controllability and observability, which are main factors of testability. The controllability is a degree of difficulty in changing a specific terminal (e.g., an output terminal of a specific gate) in a circuit to provide a specific signal by controlling a primary input value of the circuit. The observability is a degree of difficulty in observing a signal value set in a specific terminal in a circuit by controlling a primary input value of the circuit. The controllability and observability are combined to define the testability.

Generally, test points (TP) are classified into two types of test points, referred to as control points (CP) and observation points (OP). Control points are primary inputs (PI) used to enhance controllability and observation points are primary outputs used to enhance observability.

In order to improve testability, a test point insertion method enables a corresponding node to be accessible directly or indirectly from a primary input terminal or a primary output terminal. The test point insertion method conventionally applies manners of adding a pin, sharing a pin, adding a dedicated scan cell, using an exclusive-OR tree, and using a linear feedback shift register/multiple input signature register (LFSRfMISR).

The test point insertion method of adding a pin is disclosed in a paper "RP-SYN: Synthesis of Random Pattern Testable Circuits with Test Point Insertion", IEEE Trans. On Computer-Aided Design of Integrated Circuits and Systems, Vol. 18, No. 8, pp. 1202–1213, August 1999, N. A. Touba & E. J. McCluskey et al. The test point insertion method of sharing a pin is disclosed in a paper "Combining Multiple DFT Schemes with Test Generation", IEEE Trans. On Computer-Aided Design of Integrated Circuits and Systems, Vol. 18, No. 6, pp. 685–696, June 1999, B. Mathew & D. G. Saab. In this method, some of the additional pins required to be added can be shared with existing circuits. Even though an increase in the number of pins is determined by the number of select signals, the number of sharable pins is restricted. When inserting control points (CPs), if the number of sharable input pins is low, a number of CPs are shared using one input pin. Nevertheless, testability of the circuit is not completely improved. When inserting observation points (OPs), if the number of OPs is higher than that of the sharable output pins, an n-to-1 multiplexer (here, "n" is an integer of 3 or greater) can be used instead of a 2-to-1 multiplexer. Unfortunately, select signals for allocating input pins increases in number.

The test point insertion method of adding a dedicated scan cell is disclosed in a paper "Test Point Insertion Based on Path Tracing", Proceedings of the 14th VLSI Test Symposium, pp. 2–8, 1996, M. A. Touba & E. J. McCluskey. In this method, control points (CPs) are inserted using a multiplexer, an OR-type gate, an AND-type gate, and a dedicated scan cell. An existing scan chain increases length in proportion to the number of test points (i.e., inserted cells), thus increasing a time required for a scan shift operation in a test vector. Therefore, a total test time is considerably increased. Further, cells are added to thus increase chip area and power consumption.

The test point insertion method of using an exclusive-OR tree is disclosed in a paper "An Observability Enhancement Approach for Improved Testability and At-Speed Test", IEEE Trans. On Computer-Aided Design of Integrated Circuits and Systems, Vol. 13, No. 8, pp. 1051–1056, August 1994, E. M. Rudnick et. al. The exclusive-OR tree has a tree structure until, after a plurality of observation points are connected to an input terminal of one exclusive-OR gate, output terminals thereof are sequentially connected to another exclusive-OR gate and are outputted to one output pin. Because of the plural observation points, the exclusive-OR gate tree must be constructed in many steps. This leads to an increase in gate count. If a fault effect is transferred from two observation points or more, the observation points are offset, so that there is a good chance of the observation points not being observed. Consequently, the observability cannot be perfectly improved. Also, the added exclusive-OR gates can deteriorate an efficiency of an automatic test pattern generator (ATPG).

The test point insertion method of using the LFSR/MISR is disclosed in a paper "Efficient Test-Point Selection for Scan-based BIST", IEEE Trans. on Computer-Aided Design of Integration circuits and System, Vol. 6, No. 4, pp. 67–676, December 1998, H. C. Tsai et al., and in U.S. Pat. No. 5,737,340 entitled "MULTI-PHASE TEST POINT INSERTION FOR BUILT-IN SELF TEST OF INTEGRATED CIRCUITS", April 1998, Tamarapalli et al. The LFSR/MISR are mainly used as a pattern generator and a response analyzer in a built-in self test (BIST) circuit, respectively. Also, the LFSR/MISR can be used in the test point insertion. If the number of test points is great, the foregoing method generally has as a shortcoming increasing overhead with respect to area and power consumption.

Even though various test point insertion methods have been used for enhancing testability of semiconductor integrated circuits, conventional methods have shortcomings such as increasing pin overhead, increasing area overhead, increasing power consumption, increasing test time, and restrictive enhancement of the testability.

SUMMARY OF THE INVENTION

The present invention is therefore directed to testing of integrated circuits, which substantially overcomes one or more of the problems due to the limitations and disadvantages of the related art.

Thus, an object of the present invention is to provide a semiconductor integrated circuit capable of enhancing testability and minimizing overhead without performance deterioration, and minimizing an increase in area required in connection with a test point insertion method.

In accordance with one aspect of the invention, a semiconductor integrated circuit device includes a logic circuit having one or more observation points and a control point. A data transfer unit includes a plurality of scan cells that are coupled to the logic circuit. A first selection unit selects one of normal data supplied from the logic circuit or data supplied from the one or more observation points, and outputs the selected data to the data transfer unit. A second selection unit outputs one of the normal data and one of scan data transferred from the data transfer unit, to the control point.

In accordance with another aspect of the invention, a semiconductor integrated circuit device includes a logic circuit having one or more observation points and a control point. A first data transfer unit includes a plurality of scan cells that are coupled to the logic circuit. A second data transfer unit includes a plurality of scan cells that are serially coupled to the first data transfer unit. A first selection unit selects one of normal data supplied from the logic circuit and data supplied from the one or more observation points, and outputs the selected data to the first data transfer unit. A second selection unit outputs one of the normal data and one or more scan data transferred from the second data transfer unit, to the control point.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 4 shows a construction of a semiconductor integrated circuit device into which test points are integrated, in accordance with a third embodiment of the invention.

DESCRIPTION OF THE PREFERRED EMBODIMENTS

The present invention provides a semiconductor integrated circuit device that includes a logic circuit having a plurality of observation points and a control point, a plurality of scan cells coupled to the logic circuit, a first multiplexer for selecting and outputting one of normal data supplied from the logic circuit and data supplied from one or more observation points, and a second multiplexer for outputting one of the normal data and scan data transferred from the scan cells to the control point. An output of the scan cell built in the semiconductor integrated circuit may be used as a select signal of the first and second multiplexers, maximally enhancing testability of the semiconductor integrated circuit. Further, the number of added pins is reduced to minimize overhead that is caused by test point insertion.

Figure 1:
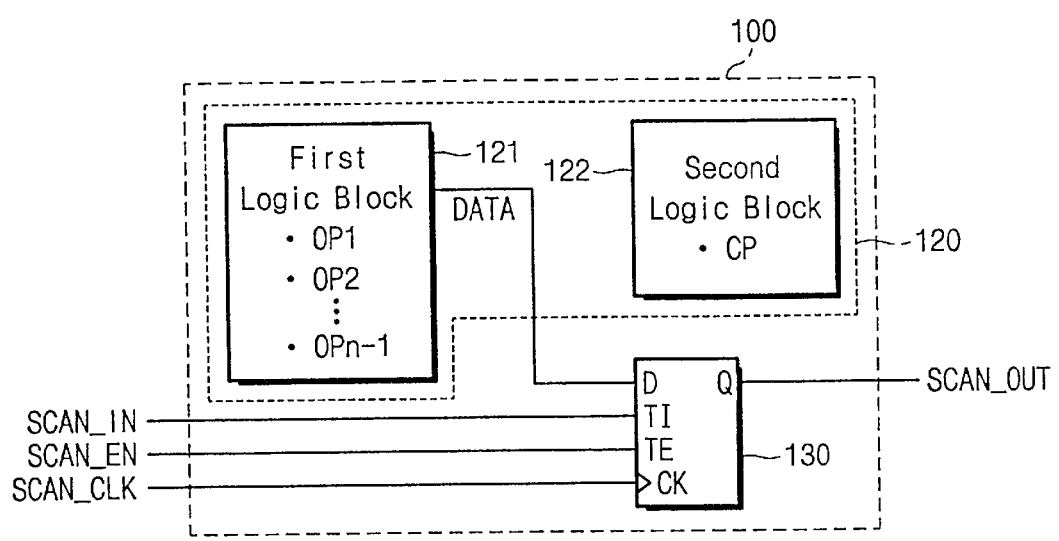
FIG. 1 shows a generic construction of a scan-designed semiconductor integrated circuit device.

Referring now to FIG. 1, a scan-designed semiconductor integrated circuit device 100 includes a logic circuit 120 composed of first and second logic blocks 121 and 122, and a scan cell unit 130 having a plurality of scan cells. Scan cell unit 130 may be one of any scan cell units as would be known to those skilled in the art, such as a SAMSUNG ELECTRONICS/FDISQ scan cell unit for example. A plurality (e.g., n−1) of observation points OP1~OPn−1 are required to be inserted into the first logic circuit 121. Also, one control point CP is required to be inserted into the second logic block 122. In the drawings, the logic circuit 120 is classified into the first and second logic blocks 121 and 122 based on the kinds of test points, respectively. However, this classification is only for convenience of description and, practically, the logic circuit 120 may not be composed of respective elements. The first logic block 121 for example may be of any general design as would be understood by one of ordinary skill. Although the second logic block 122 includes one control point CP, it may include a plurality of control points according to circuit design. The second logic block 122 may be of any general design as would be understood by one of ordinary skill. The scan cell unit 130 receives the output DATA of the first logic block 121 and externally input scan data SCAN_IN, carrying out normal and scan operations.

Figure 2:
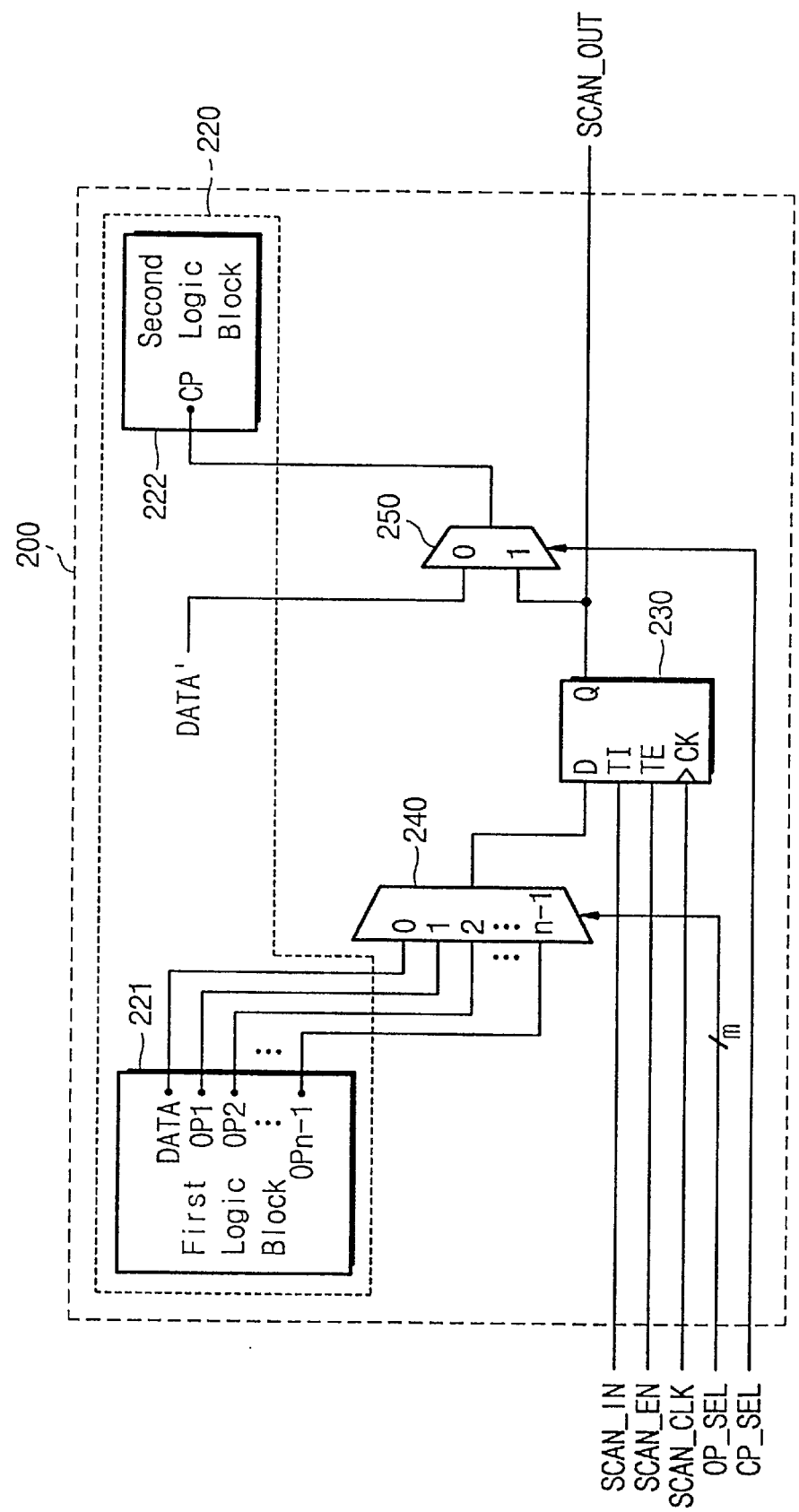
FIG. 2 shows a construction of a semiconductor integrated circuit device into which test points are inserted, in accordance with a first embodiment of the invention.

Embodiments to insert test points into a circuit having such a construction as in FIG. 1, will now be described with reference to FIG. 2 through FIG. 4. Referring to FIG. 2, a semiconductor integrated circuit device 200 according to a second embodiment of the invention has test points inserted thereinto, using scan cells built in a semiconductor integrated circuit such as a scan cell unit 130 shown in FIG. 1. For this, the semiconductor integrated circuit device 200 includes first and second logic blocks 221 and 222 and a scan cell unit 230, as well as first and second multiplexers 240 and 250. The first and second logic blocks 221 and 222, and the scan cell unit 230, are identical to those of the first and second logic blocks 121 and 122, and the scan cell unit 130 shown in FIG. 1. In the drawings, only one scan cell is shown as the scan cell unit 230. The only one scan cell, however, is merely a representative one of plural scan cells that can be used for test point insertion.

Now, a circuit wherein an observation point OP is inserted will be described hereinafter. Normal data DATA output from the first logic block 221 of the logic circuit 220, and a plurality of data supplied from a plurality of observation points OP1~OPn−1 in the first logic block 221, are coupled to n-numbered input terminals of the first multiplexer 240. An output of the first multiplexer 240 is coupled to a data input D of one of the scan cells of the scan cell unit 230. In this case, m-numbered observation point select signals OP_SEL (m=$\log_2(n)$ for n=$2^k$, m=$[\log_2(n)]+1$ for n≠$2^k$, n≧2, n and k are integers) for selecting the output of the first multiplexer 240 are input via an input pin of the semiconductor integrated circuit device 200. The selected data in the first multiplexer 240 is captured by the data input D of any scan cell of the scan cell unit 230, and is observed by a scan shift operation. If the semiconductor integrated circuit device 200 carries out a normal operation, the observation point select signal OP_SEL is set to select the normal data DATA.

In the device 200, the number and size of the multiplexer 240 used for inserting the observation points OP are influenced by the number of scan cells that are usable in a circuit. For example, if there are a sufficient number of usable scan cells, the multiplexer 240 is composed of a plurality of 2-to-1 multiplexers using one observation point select signal OP_SEL. If there are a deficient number of usable scan cells, an n-to-1 multiplexer (n is 3 or more) using m-numbered observation point select signals OP_SEL is used.

Now, a circuit wherein a control point CP is inserted will be described hereinafter. Normal data DATA' output from a further unillustrated stage of the logic circuit 220 subsequent first logic block 221, and test data SCAN_OUT output from any scan cell in the circuit, are coupled to inputs of the second multiplexer 250. An output of the second multiplexer 250 is coupled to the control point CP in the second logic block 222 of the logic circuit 220. The second multiplexer 250 for transferring a signal to the control point CP is composed of a 2-to-1 multiplexer for selecting and outputting the normal data DATA' or the test data SCAN_OUT in response to a control point select signal CP_SEL supplied from an input pin of the semiconductor integrated circuit device 200. If the device 200 carries out a normal operation, the control point select signal CP_SEL is set to select the normal data DATA'.

In the device 200, the number of scan cells for inserting the control points CP and second multiplexers 250 is influenced by the number of the control points CP in a circuit. For example, if there are n-numbered control points CP in the circuit, n-numbered scan cells and 2-to-1 multiplexers are used for inserting n-numbered control points. In this case, the control point select signals CP_SEL are shared with one select signal to be used.

In the semiconductor integrated circuit device 200, the number of pins added for inserting test points is equal to a total of the observation point control signals OP_SEL and control point select signals CP_SEL. At least two pins are added. If the number of the observation points OP is less than that of the usable scan cells, the number of added pins is fixed to two (i.e., one observation control signal OP_SEL and one control point select signal CP_SEL) irrespective of the number of the test points. Therefore, the test point insertion method according to the first embodiment of the invention has much less overhead than a conventional method. Since the multiplexers 240 and 250 require less amount of gate count than other methods, an area added in a circuit is very small. The semiconductor integrated circuit device 200 uses existing scan cells constructed in a circuit, so that no additional switching elements are added. Therefore, power consumption is scarcely increased. With respect to testability, observability is completely enhanced, and controllability is also completely enhanced if reconvergent fan-out does not occur.

Figure 3:
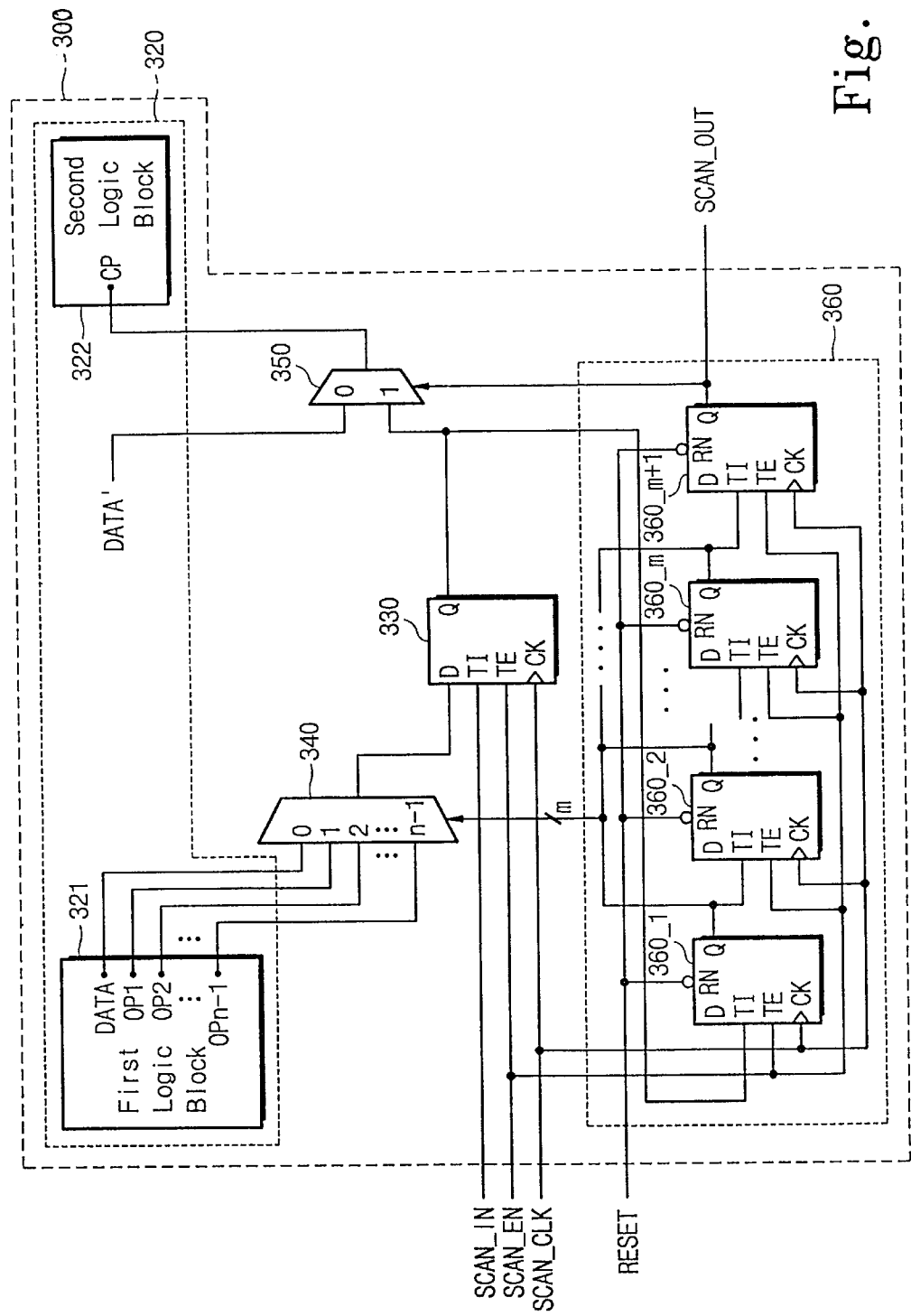
FIG. 3 shows a construction of a semiconductor integrated circuit device into which test points are inserted, in accordance with a second embodiment of the invention.

Referring to FIG. 3, a semiconductor integrated circuit device 300 according to a third embodiment of the invention has a construction which can further reduce the number of pins added than that of the semiconductor integrated circuit device 200 shown in FIG. 2. In the third embodiment, dedicated scan cells 360 are inserted for supplying select signals to first and second multiplexers 340 and 350. The inserted dedicated scan cells 360 are coupled to existing scan cells included in a scan cell unit 330. The scan cell unit 330 is composed of not one scan cell but a plurality of scan cells that are serially coupled to each other. In the drawings, the scan cell unit 330 is simplified.

As shown in FIG. 3, each of the inserted dedicated scan cells 360 has a reset function. A reset signal RESET, which is applied to each scan cell, is commonly supplied from one input pin. In inserting the dedicated scan cell 360 of the device 200 having such a construction, if a scan cell without the reset function is inserted, a data output terminal of each scan cell is coupled to one input terminal of a 2-input AND gate. The reset signal RESET is coupled to another input terminal of the 2-input AND gate, and an output signal of the AND gate is output as a select signal to the first and second multiplexers 340 and 350. Then, the device 300 carries out an operation that is identical to the operation of the dedicated scan cells having the reset function.

The reset signal RESET is set to select normal data DATA and DATA', when the device 300 carries out a normal operation. For example, if the reset signal RESET is set to "0", data outputs of all the dedicated scan cells 360 are reset to "0". In response to the data outputs, the normal data DATA and DATA' are selected and output in the first and second multiplexers 340 and 350. If the reset signal RESET is set to "1", data output from each of the dedicated scan cells 360 by a scan operation are supplied to the first and second multiplexers 340 and 350. The output data are used as select signals for selecting observation points OP1~OPn−1 and control points CP.

In this case, if there is a test mode signal provided to the device 300 for selecting whether the device is operating in a normal mode or a test mode, the reset signal RESET does not require a separate input pin. It is to be understood that a scan test mode and a normal operation mode are operable when a test mode signal supplied to an input pin of the device 300 is set to "1" and "0", respectively. If the test mode signal is used as a reset signal RESET for the dedicated scan cells 360, the circuit carries out an operation that is identical to the operation of the above-described circuit. Therefore, it is not necessary to allocate a separate input pin for the reset signal RESET. Since one or more test mode select pins are usually constructed in a circuit, adding the input pin for the reset signal RESET is practically unnecessary.

In the foregoing test point insertion method, the number of added scan cells 360 as a minimum is two and as a maximum is "m+1" (m=$\log_2(n)$ for n=$2^k$, m=[$\log_2(n)$]+1 for n≠$2^k$, n≧2, n and k are integers), compared with the method illustrated in FIG. 2. Thus, area and power consumption are slightly increased, which are ignorable. Since there is no added pin, overhead caused by the added pin can be reduced.

Referring to FIG. 4, a semiconductor integrated circuit device 400 according to a fourth embodiment of the invention can further reduce the number of pins required than in the semiconductor integrated circuit device 200 shown in FIG. 2. Test points are inserted into the device 400, using scan cells 432 that are a part of scan cells 430 constructed in an existing circuit, instead of using the dedicated scan cells 360 used in the semiconductor integrated circuit device 300 shown in FIG. 3. Since both added input pins and scan cells are not required, the foregoing method realizes all the advantages of the first and second embodiments of the invention.

The device 400 includes a scan cell unit 430 that is composed of a first scan cell block 431 for carrying out an original scan operation and a second scan cell block 432 for not only carrying out the original scan operation, but also for inserting test points such as an observation point (OP) and a control point (CP). For simplifying the drawing, a plurality of scan cells composing the blocks 431 and 432 are partially illustrated.

The data output terminals Q of respective scan cells $432_{-1}$, $432_{-2}$, ..., $432_{-m}$, and $432_{-m+1}$, composing the second scan cell block 432 are coupled to respective ones of input terminals of 2-input AND gates. The other terminals of the AND gates are coupled to a reset signal RESET. Outputs of the AND gates are provided as select signals to first and second multiplexers 440 and 450. Even though the scan cells $432_{-1}$, $432_{-2}$, ..., $432_{-m}$, and $432_{-m+1}$, of FIG. 4 are shown without a reset function, it is to be understood that these scan cells may or may not have the reset function, in accordance with the kind of scan cells included in the scan cell unit 430.

When the device 400 carries out a normal operation, the reset signal RESET is set to select normal data DATA and DATA'. For example, if the reset signal RESET is set to "0", data outputs of scan cells $432_{-1}$, $432_{-2}$, $432_{-m}$, and $432_{-m+1}$ in the second scan cell block 432 are reset to "0" for allowing the circuit to carry out a normal operation. Thus, the normal data DATA and DATA' are selected out of inputs of the first and second multiplexers 440 and 450. If the reset signal RESET is set to "1", output data of the scan cells $432_{-1}$, $432_{-2}$, ..., $432_{-m}$, and $432_{-m+1}$, is supplied, as a select signal for selecting the observation points OP1~OPn−1 and control points, to the first and second multiplexers 440 and 450.

In this case, if there is a test mode signal in a circuit, the reset signal RESET does not require a separate input pin. Accordingly, the device 400 realizes all the advantages of the circuit devices 200 and 300 according to the first and second embodiments of the invention. That is, test points can be inserted into the device 400 without adding dedicated scan cells and the number of pins added for inserting the test points can be reduced.

In accordance with the present invention, testability can maximally be enhanced and overhead (e.g., performance deterioration and increase in a required area) caused by test point insertion can be minimized.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

We claim:

1. A semiconductor integrated circuit device into which test points are inserted comprising:
    a logic circuit having one or more observation points and at least one control point;
    a data transfer unit including a plurality of scan cells coupled to the logic circuit;
    a first selection unit that selects one of either first normal data supplied from the logic circuit and data supplied from the one or more observation points, and that outputs the selected data to the data transfer unit; and
    a second selection unit that outputs one of either second normal data supplied from the logic circuit and one or more scan data transferred from the data transfer unit, to the at least one control point.

2. The semiconductor integrated circuit device of claim 1, wherein the second selection unit is a 2-to-1 multiplexer that selects one of either the scan data transferred from one of the plurality of scan cells of the data transfer unit and the second normal data, in response to a second select signal that is externally provided.

3. The semiconductor integrated circuit device of claim 2, wherein the logic circuit includes n control points and the semiconductor integrated circuit device includes n second selection units, the n second selection units each being coupled to n scan cells of the data transfer unit.

4. The semiconductor integrated circuit device of claim 3, wherein the second select signal is provided to each of the n second selection units.

5. The semiconductor integrated circuit device of claim 1, wherein the first selection unit is an n-to-1 multiplexer that selects one of either the first normal data and the data from the one or more observation points, in response to a first select signal that is externally provided, wherein the one or more observation points include (n−1) observation points.

6. A semiconductor integrated circuit device comprising:
    a logic circuit having one or more observation points and at least one control point;
    a first data transfer unit including a plurality of scan cells coupled to the logic circuit;
    a second data transfer unit including a plurality of scan cells serially coupled to the first data transfer unit;
    a first selection unit that selects one of either first normal data supplied from the logic circuit and data supplied from the one or more observation points, and that outputs the selected data to the first data transfer unit; and
    a second selection unit that outputs one of either second normal data supplied from the logic circuit and one or more scan data transferred from the first data transfer unit, to the control point.

7. The semiconductor integrated circuit device of claim 6, wherein the first selection unit is an n-to-1 multiplexer that selects one of either the first normal data and the data from the one or more observation points, in response to a first select signal supplied from the second data transfer unit.

8. The semiconductor integrated circuit device of claim 7, wherein the first select signal comprises an output signal of the scan cells of the second data transfer unit.

9. The semiconductor integrated circuit device of claim 6, wherein the second selection unit is a 2-to-1 multiplexer that selects one of either the scan data of the first data transfer unit and the second normal data, in response to a second select signal supplied from the second data transfer unit.

10. The semiconductor integrated circuit device of claim 9, wherein the second select signal is an output signal of a scan cell of the second data transfer unit.

11. The semiconductor integrated circuit device of claim 6, wherein the scan cells of the second data transfer unit are resettable by a reset signal, to respectively select the first and second normal data in the first and second selection units during a normal operation.

12. The semiconductor integrated circuit device of claim 11, wherein a signal for selecting normal and test operations of the semiconductor integrated circuit device is externally applied as the reset signal.

13. The semiconductor integrated circuit device of claim 6, wherein the scan cells of the second data transfer unit are not resettable, and the second data transfer unit further includes a reset signal transfer unit that outputs a reset signal to the first and second selection units to respectively select the first and second normal data in the first and second selection units during a normal operation.

14. The semiconductor integrated circuit of claim 13, wherein a signal for selecting normal and test operations of the semiconductor integrated circuit device is externally provided as the reset signal.

15. The semiconductor integrated circuit device of claim 6, wherein the logic circuit includes n control points and the semiconductor integrated circuit device includes n second selection units, the n second selection units each being coupled to n scan cells of the first data transfer unit.

16. The semiconductor integrated circuit device of claim 6, wherein existing scan cells of the semiconductor integrated device are used as the scan cells of the second data transfer unit.

17. The semiconductor integrated circuit device of claim 6, wherein scan cells that are added on to the semiconductor integrated circuit are used as the scan cells of the second data transfer unit, instead of existing scan cells of the semiconductor integrated circuit device.

* * * * *